(12) United States Patent
Nakamura et al.

(10) Patent No.: US 6,383,294 B1
(45) Date of Patent: May 7, 2002

(54) COATED FILM FORMING APPARATUS

(75) Inventors: Yoshiaki Nakamura, Kanagawa-ken; Toshimitsu Omine, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/471,495

(22) Filed: Dec. 23, 1999

(30) Foreign Application Priority Data

Dec. 25, 1998 (JP) .......................................... 10-369326

(51) Int. Cl.$^7$ .............................. B05C 13/00; B05B 1/24
(52) U.S. Cl. .......................... 118/666; 118/52; 118/612
(58) Field of Search .......................... 118/52, 602, 603, 118/610, 612, 666, 667, 56–58; 427/240

(56) References Cited

U.S. PATENT DOCUMENTS 5,127,362 A * 7/1992 Iwatsu et al. ............... 118/667
6,036,426 A * 3/2000 Hillman .................. 414/331.14
6,063,439 A * 5/2000 Semba et al. ................ 427/240
6,190,458 B1 * 2/2001 Harada ....................... 118/715

* cited by examiner

*Primary Examiner*—Richard Crispino
*Assistant Examiner*—Yewebdar T T
(74) *Attorney, Agent, or Firm*—Oblon, Spivak, McClelland, Maier & Neustadt, P.C.

(57) ABSTRACT

Provided is a coating film forming apparatus capable of shortening an operating time without considerably altering the design of the apparatus and changing the physical properties of a material such as a resist solvent. A spin coater for spreading a coating solution 5 dropped onto a substrate 1 to be coated over the substrate 1 to be coated by the centrifugal pump action performed with the rotation of the substrate 1 to be coated and for evaporating a solvent in the coating solution 5 to form a coating film on the substrate 1 to be coated, a tank 14 for storing the coating solution, and a housing case 15 for accommodating the substrate to be coated are provided in a casing P, and the casing P is provided in a cleaning room. A temperature in the casing P is set higher than a temperature in the clean room on the outside of the casing P by using temperature control devices 30, 31, 32 and 33. Consequently, an operating time can be shortened.

14 Claims, 10 Drawing Sheets

COATED FILM FORMING APPARATUS

BACKGROUND OF THE INVENTION

1. Field of the Invention

The present invention relates to a coating film forming apparatus comprising a spincoater for feeding a coating solution onto a substrate to be coated and rotating the substrate to be coated, thereby forming a desired film.

2. Description of the Related Art

Examples of a method for forming a coating film having a uniform thickness on a substrate to be coated such as a semiconductor wafer, a liquid crystal substrate and the like includes a spin coat method. This is a method for rotating the substrate to be coated onto which a coating solution such as a photo-resist is dropped, thereby spreading, by rotary centrifugal force, the coating solution over the whole surface of the substrate to be coated and evaporating a solvent in the coating solution to form a coating film.

The substrate to be coated such as a wafer is held horizontally on a spin chuck of a vacuum adsorption type. A nozzle for dropping a coating solution such as a resist on the upper surface of the substrate to be coated is provided above the chuck. These elements other than a motor are accommodated in a chamber for preventing the coating solution from being scattered and collecting the scattered coating solution. The chuck is connected to a rotary shaft. The rotary shaft is rotationally supported by the motor.

An air flow inlet is formed in the central part of the upper portion of the chamber. An air flow outlet is formed in the peripheral portion on the lower wall of the chamber. The air flow inlet is connected to a gas feeding device for feeding an inactive carrier gas. Each air flow outlet is connected to an exhausting device through an exhaust duct.

The base end side of the nozzle communicates with a coating solution tank through a coating solution feeding pump.

A housing case for the substrate to be coated is provided in the vicinity of the chamber. A plurality of members to be applied are accommodated in the housing case.

In order to form a coating film such as a resist on the surface of the substrate to be coated by using the apparatus having such a structure, the following procedure is employed.

First of all, a carrier gas is fed from the air feeding device into the chamber and the exhausting device is operated.

Next, the substrate to be coated is taken out, by means of an arm (not shown) from the housing case for the substrate to be coated. Then, the substrate to be coated is fixed onto the chuck through a window openably formed on the peripheral wall of the chamber, and the window is closed. At this time, the carrier gas flows in a direction orthogonal to the upper surface of the substrate to be coated, and flows over the coated surface in a circumferential direction.

Subsequently, the coating solution is dropped in a predetermined amount from the nozzle onto the substrate to be coated.

Then, the rotation of motor is started so that the substrate to be coated is rotated for a constant time.

By thus rotating the substrate to be coated, the coating solution dropped onto the substrate to be coated is spread by centrifugal force over the whole surface of the substrate to be coated and a solvent contained in the coating solution is evaporated. Consequently, a solid—state resist film is formed on the surface of the substrate to be coated.

The thickness of the resist film is occupied by the spread of the coating solution by the centrifugal force in the initial stage of an application process. However, when a viscosity is increased and the fluidity of the coating solution is lowered with the evaporation of the solvent, the thickness of the resist film is occupied by only the amount of evaporation of the solvent. Finally, the application process is terminated when the solvent cannot be evaporated from the gas—liquid interface.

The coating solution scattered from the substrate to be coated during the formation of the coating film is captured on the inner peripheral face of the chamber. Moreover, a gas is fed in an amount suitable for a process work from the gas feeding device. Then, the gas is exhausted in an amount corresponding to the process work by means of the exhausting device through each exhaust duct.

However, the conventional spin coater having the above-mentioned structure has had the following problems.

More specifically, it has been required that an operating (coating) time should be shortened in order to enhance productivity in the field of semiconductor industries which use such an apparatus. By shortening the operating time, the processing amount per unit time is increased to twice if the operating time is reduced by half, and the number of apparatuses is reduced by half if the total of processes is the same. Thus, advantages can be obtained in respect of plant and equipment investment.

In order to shorten the operating time, it is sufficient that the amount of solvent evaporation per unit time is increased. For this purpose, it is proposed that the physical properties of the resist are changed. However, the kind of the physical properties of the solvent are restricted to some extent depending on the easiness of dissolution of a resist resin in consideration of people and environment. Therefore, there is a limit to change the physical properties of the solvent.

On the other hand, it is also proposed that the operating time is shortened by increasing the number of rotations which is the operating condition of the apparatus. However, if the number of rotations is changed, the thickness of a resist film is affected. Therefore, there is naturally a limit. More specifically, if the number of rotations is increased, the centrifugal force is increased. As a result, the thickness of the resist film is reduced. Consequently, it becomes hard to obtain the desired thickness of the resist film.

As described above, the conventional spin coater has had a problem in that it is difficult to shorten the operating time due to conditions such as the matters of the physical properties of a solvent, the matters of the thickness of a coating film and the like, resulting in no contribution to an enhancement in productivity.

SUMMARY OF THE INVENTION

Therefore, it is an object of the present invention to provide a coating film forming apparatus which can shorten an operating time without considerably changing the design of the apparatus and the physical properties of a material such as a resist solvent or the like.

A coating film forming apparatus comprising:

a spin coater including a holder for rotatably holding a substrate to be coated and a nozzle provided above the substrate to be coated which is held by the holder for dropping a coating solution onto a surface of the substrate to be coated, and serving to rotate the holder to spread the coating solution over the substrate to be coated by centrifugal force, thereby forming a coating film on the surface of the substrate to be coated;

a chamber for covering the spin coater to form a constant space around the spin coater;

a coating solution feeding pump connected to the nozzle for feeding the coating solution into the chamber;

a coating solution tank coupled to the coating solution feeding pump for storing the coating solution;

a gas introducing pipe connected to the chamber for introducing a gas into the chamber;

a gas exhaust pump connected to the chamber for exhausting a gas from the chamber;

a tank for the substrate to be coated provided on an outside of the chamber for storing the substrate to be coated delivered into the chamber;

a casing including therein the spin coater, the chamber and the tank for the substrate to be coated; and a temperature control device provided in the casing for controlling a temperature in the casing to be higher than a temperature on an outside of the casing.

According to the present invention, as described above, the operating time can be shortened without considerably changing the design of the apparatus, resulting in a contribution to an enhancement in productivity.

DESCRIPTION OF THE PREFERRED EMBODIMENTS

The structure of a coating film forming apparatus according to the present invention will be described below with reference to the drawings.

Figure 1:
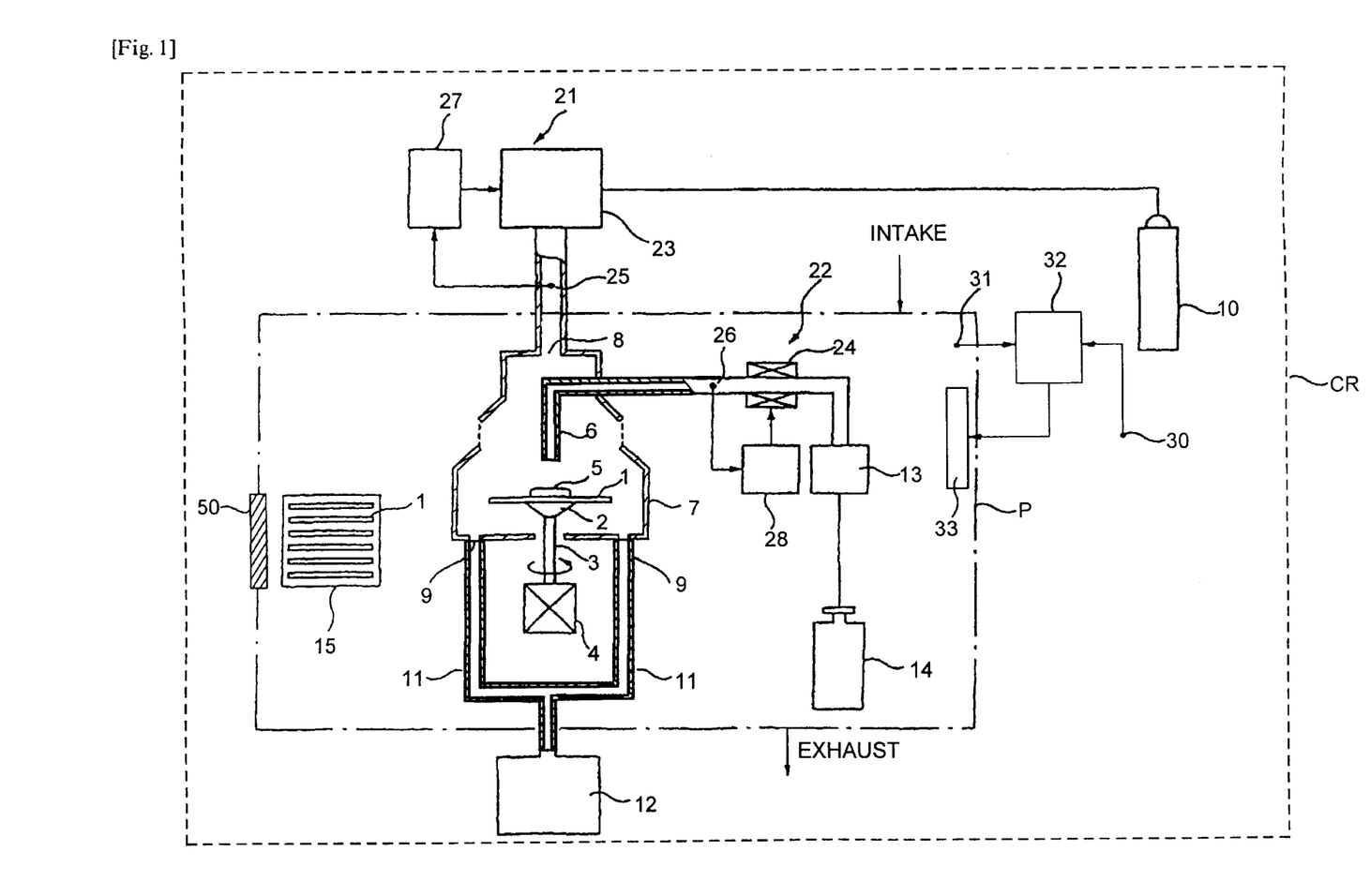
FIG. 1 is a diagram showing the structure of a coating film forming apparatus according to a first embodiment of the present invention.

FIG. 1 is a diagram showing the structure of a coating film forming apparatus according to a first embodiment of the present invention.

The first embodiment is characterized in that a temperature measuring sensor 30 (a temperature control device) is provided in a clean room (within a dotted line) having a casing P (within a one—dotted chain line) and a temperature measuring sensor 31 (a temperature control device) is provided in the casing P, and an in—casing heating device 33 (a temperature control device) is controlled by means of a temperature control device 32 (a temperature control device) to set a temperature in the casing P higher than the temperature of the clean room.

A substrate 1 to be coated such as a wafer which has a substantially flat surface is rotatably held horizontally on a spin chuck 2 (a holder) of a vacuum adsorption type. A nozzle 6 for dropping a coating solution 5 such as a resist on the upper surface of the substrate 1 to be coated is provided above the chuck 2. These elements other than a motor 4, e.g. AC servo-motor, are accommodated in a chamber 7 serving to prevent the coating solution 5 from being scattered and to collect the scattered coating solution 5. The chuck 2 is connected to a rotary shaft 3. The rotary shaft 3 is rotatively supported by the motor 4. A spin coater has the chuck 2, the rotary shaft 3, the motor 4 and the chamber 7 for covering them.

The chamber 7 is provided to form a constant space around the spin coater having the substrate 1 to be coated, the chuck 2 and the nozzle 6. An air flow inlet 8 acting as one of the ends of a gas introducing pipe is formed in the central part of the upper portion of the chamber 7. An air flow outlet 9 is formed in the peripheral portion on the lower wall of the chamber 7. The air flow inlet 8 is connected to a gas feeding device 10 for feeding an inactive carrier gas. Each air flow outlet 9 is connected to a gas exhaust pump 12 through an exhaust duct 11.

The base end side of the nozzle 6 communicates with a coating solution tank 14 through a coating solution feeding pump 13.

A housing case 15 for a substrate to be coated (a tank for a substrate to be coated) is provided in the vicinity of the chamber 7, and accommodates a plurality of substrates 1 to be coated therein.

A gas temperature control device 21 (gas temperature control means) is provided between the air flow inlet 8 and the gas feeding device 10 to keep the predetermined temperature of a gas flow fed into the chamber 7 by means of the gas temperature control device 21. Moreover, a coating solution control device 22 is provided in the middle of the nozzle 6. By the coating solution control device 22, the coating solution 5 dropped from the nozzle 6 onto the substrate 1 to be coated is kept at a predetermined temperature.

The temperature control device 21 and the coating solution control device 22 are mainly constituted by an electric heating device and the like, and comprise heating devices 23 and 24 for heating the air flow and the coating solution respectively, temperature sensors 25 and 26 for detecting the temperatures of the air flow fed in the downstream region of the heating devices 23 and 24 and the coating solution, and input control devices 27 and 28 for introducing the outputs of the temperature sensors 25 and 26 to control the inputs of the heating devices 23 and 24 in such a manner that the temperature of the air flow fed into the chamber 7 and the temperature of the coating solution 5 dropped onto the substrate 1 to be coated have preset values. As energy sources for the heating devices 23 and 24, it is possible to use steam as well as electricity. The temperature of the carrier gas is controlled by means of the temperature control device 21. Therefore, it is possible to obtain a desirable evaporation rate.

Moreover, there has been used the exhausting device 12 having the capability for exhausting a gas in a larger amount than the sum of the amount of the carrier gas fed from the carrier feeding device 10 and the amount of the airflow exhausted along the surface of the substrate 1 to be coated by the centrifugal pumping action performed by the rotation of the substrate 1 to be coated.

The casing P is provided with at least the spin coater, the housing case 15, the temperature control device 22, the coating solution tank 14, the coating solution feeding pump 13, the nozzle 6, the heating device 33 and the sensor 31. The casing P is provided with an entrance for a user and replacement articles such as the substrate 1 to be coated to get in or out and is set in an almost closing state.

The outside of the casing P indicates a region in a clean room which is provided on the outside of the casing P. Moreover, the clean room indicates a space which has less impurities than in the air and is almost closed.

Figure 2:
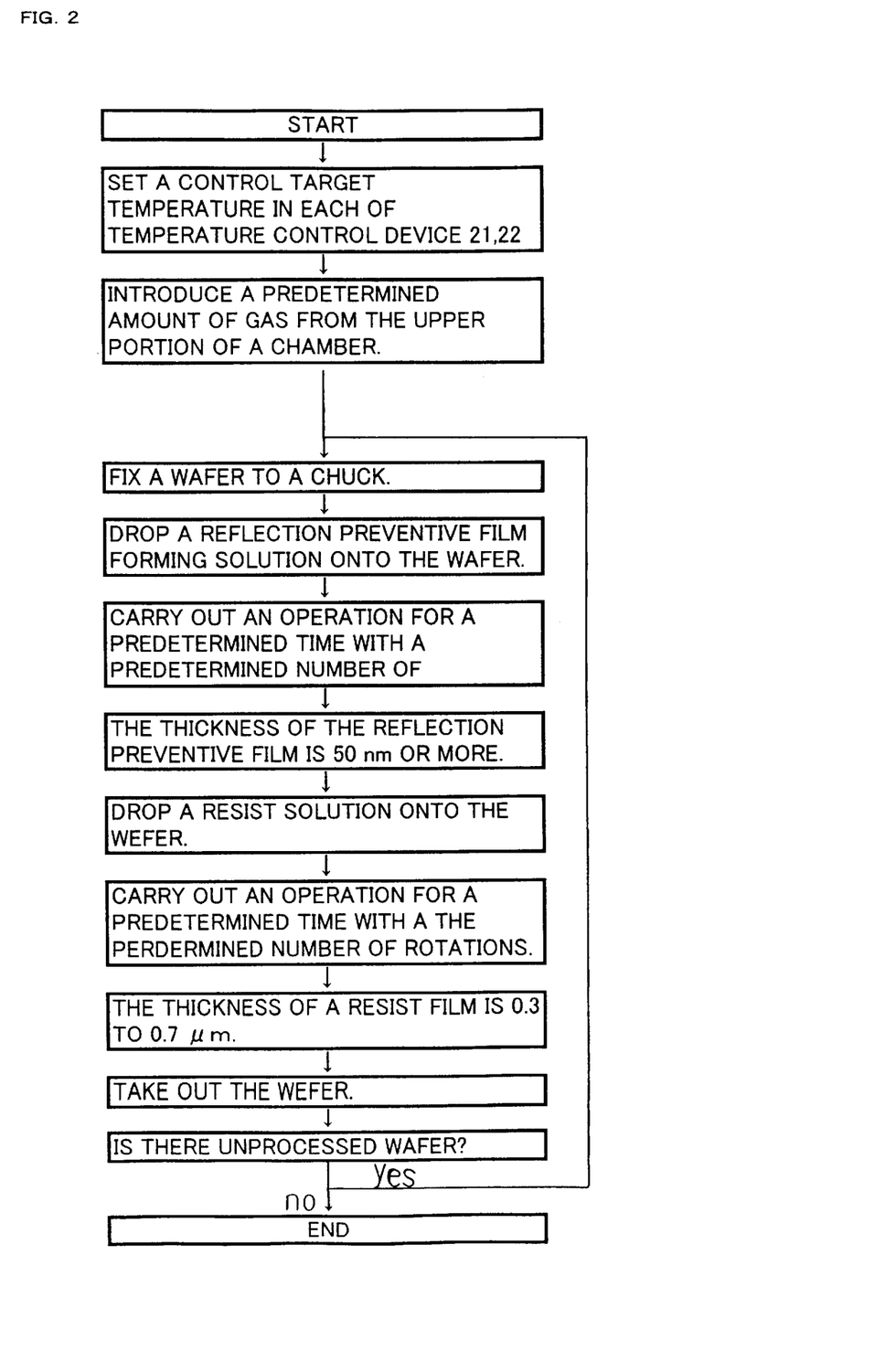
FIG. 2 is a diagram illustrating the operation of the coating film forming apparatus according to the present invention.

Next, the case where a resist film is formed on a semiconductor wafer as a substrate to be coated by using the coating film forming apparatus having the above-mentioned structure will be described below with reference to the flow shown in FIG. 2. It is assumed that a temperature in the clean room is set to a desirable temperature which is equal to or lower than 23 degrees.

Before the operation for forming the coating film is carried out, the housing case 15 is introduced into the casing P from an openable/closable window 50 which is provided in the predetermined position of the casing P. In some cases, a plurality of housing cases 15 are provided depending on the number of substrates 1 to be coated which are to be processed.

First of all, a control target temperature in each of the temperature control devices 21 and 32 and the coating solution control device 22 is set.

Next, a predetermined amount of carrier gas is started to be fed from the gas feeding device 10. Simultaneously with the feeding operation, the operation of the exhausting device 12 is started so that the gas is started to be exhausted from the chamber 7. The gas sent from the gas feeding device 10 is kept at a predetermined temperature, for example, 30° C. by the temperature control device 21 and is fed into the chamber 7. After this step, the chamber 7 has a reduced pressure and the inside of the casing 7 is pressurized on the outside of the chamber 7. Consequently, the gas rarely leaks from the casing P to the outside of the spin coater.

Next, the wafer acting as the substrate 1 to be coated is taken out from the housing case 15 for the substrate to be coated by means of an arm which is not shown, and is fixed onto the chuck 2 through a window openably/closably formed on the peripheral wall of the chamber 7 and the window is closed. The temperature of the substrate 1 to be coated which is obtained immediately before the gas is fed into the chamber 7 is equal to a temperature in the casing P which is substantially higher than a temperature on the outside of the casing P.

Then, a reflection preventive film forming solution is dropped onto the wafer from a reflection preventive film material feeding system which is not shown, and subsequently, the motor 4 is started to be rotated.

The operation is carried out for a predetermined time with the predetermined number of rotations, and the rotation is stopped when the thickness of the reflection preventive film is set to a predetermined value, for example, about 50 (nm). Thereafter, a resist solution acting as the coating solution 5 is dropped from the nozzle 6 toward the wafer surface. The resist solution is kept at a predetermined temperature, for example, 30° C. by the temperature control device 22.

As described above, the air flow having a temperature of 30° C. is fed into the chamber 7. Moreover, the resist solution heated to 30° C. is applied onto the wafer. Therefore, the temperature of the resist solution on the wafer is kept at about 30° C., for example.

Subsequently, the substrate 1 to be coated is operated for a predetermined time with the predetermined number of rotations by means of the motor 4. By this operation, the resist solution dropped onto the wafer is spread over the whole surface of the wafer by centrifugal force, and the solvent in the resist solution is evaporated to form a solid—state resist film on the wafer.

When the thickness of the resist film is set to 0.3 to 0.7 ($\mu$m), the motor 4 is stopped to take the wafer out of the chamber 7. Thus, the process is completed.

The wafer taken out of the chamber 7 is moved into a predetermined standby position by a robot arm (not shown) and is then discharged from the window 50 to the outside of the casing P.

While an intake and exhaust system for an air flow into the casing P is usually provided as a part of the equipment of the clean room in the same manner as electric power, it may be accessory equipment for the spin coater itself.

Moreover, the atmosphere in the casing P is controlled by the temperature control device 32. By the temperature sensor 31 provided in the casing P and the temperature sensor 30 provided in the clean room, the temperature in the casing P is always controlled to be higher than the temperature in the clean room. More preferably, the temperature in the casing P is set within a range of 7° C. ±5° C. with respect to the temperature in the clean room on the outside of the casing.

At such a rotary coating step, the operating time is defined a time period from the dropping operation of the coating solution 5 onto the substrate 1 to be coated till the formation of a solid—state resist film on the surface of the substrate 1 to be coated.

According to the study of the inventors, it was found that the operating time greatly depends on the evaporation rate of the solvent contained in the coating solution and the evaporation rate of the solvent can be increased to shorten the operating time if the temperature of the coating solution 5 is raised.

More specifically, the inventors obtained, by calculation, the operating time by setting the temperature of the coating solution on the substrate 1 to be coated at 20° C., 23° C., 25° C. 30° C. and 35° C. for five kinds of coating solutions A to E having the apparent physical properties of a solvent. As a result, values shown in Table 1 were obtained. This calculation is carried out on the condition that the diameter of the substrate 1 to be coated and the number of rotations thereof are kept constant and an coating thickness of 1 ($\mu$m) is obtained.

TABLE 1

|   | 20° C. | 23° C. | 25° C. | 30° C. | 35° C. |       |
|---|--------|--------|--------|--------|--------|-------|
| A | 28     | 24     | 22     | 16     | 12     | (sec) |
| B | 30     | 27     | 25     | 18     | 14     | (sec) |
| C | 34     | 29     | 26     | 19     | 15     | (sec) |

TABLE 1-continued

|   | 20° C. | 23° C. | 25° C. | 30° C. | 35° C. |       |
|---|--------|--------|--------|--------|--------|-------|
| D | 39     | 35     | 31     | 22     | 18     | (sec) |
| E | 47     | 40     | 35     | 24     | 20     | (sec) |

As is apparent from the Table 1, if the temperature of the coating solution 5 is raised, the evaporation rate of the solvent can be increased. As a result, the operating time can be shortened.

Moreover, if the temperature is raised too much so that the evaporation rate of the solvent is increased too much, there is caused a phenomenon in which the surface portion of the resist solution is solidified earlier and the solvent remains in a portion thereunder. In such a state, conversely, the operating time is prolonged. Accordingly, the temperature has an upper limit of about 40° C. according to the study of the inventors.

According to the first embodiment, therefore, the temperature of the coating solution 5 on the substrate 1 to be coated is set to a temperature which is equal to or higher than the temperature in the clean room, for example, 30° C. or more by using the temperature control device 21, the temperature control device 22, and the temperature control device 32 and is kept at 40° C. or less at which the evaporation rate is too high to form a solid film. Consequently, the operating time can considerably be shortened. Moreover, it is sufficient that each of the temperature control device 21, 22 and 32 is added. Therefore, it is not necessary to greatly change the design. Accordingly, the invention can also be applied to existing apparatuses.

The coating solution 5 may be dropped after the number of rotations of the substrate 1 to be coated is increased to a predetermined position. Moreover, the gas feeding device 10 and the exhausting device 12 may be operated before the coating solution 5 is dropped, and furthermore, they may be continuously operated. In addition, while the temperature control device 21, the temperature control device 22 and the temperature control device 32 are provided, only one temperature control device capable of setting the temperature of the coating solution on the substrate 1 to be coated to a predetermined temperature can be provided. Depending on various conditions, moreover, the temperature in the casing can also be controlled by only the temperature control device 32 and the same effects can be obtained.

Furthermore, the effect of shortening the operating time can be obtained only by controlling the gas fed from the gas feeding device 10 to have a predetermined temperature by means of the temperature control device 21 to feed the same gas into the spin coater.

Besides, even if the temperature of the substrate to be coated is substantially equal to at least one of the temperatures of the carrier gas, the coating solution and the housing case 15, the effect of shortening the operating time can be obtained.

Figure 3:
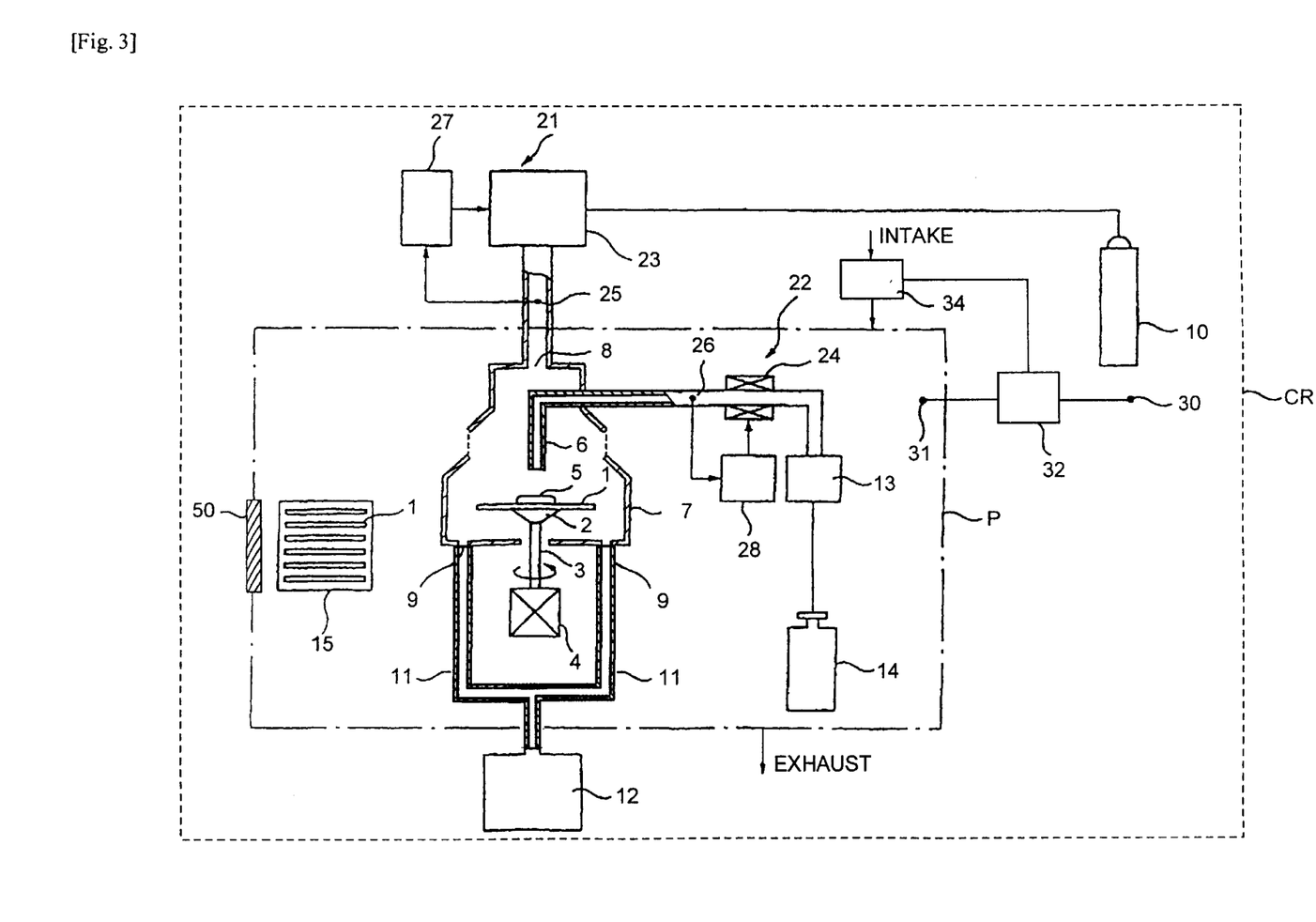
FIG. 3 is a diagram showing the structure of a coating film forming apparatus according to a second embodiment of the present invention.

Next, the structure of a coating film forming apparatus according to a second embodiment of the present invention will be described with reference to FIG. 3.

The second embodiment is characterized in that the temperature of a gas fed from the outside of a casing P into the casing P is controlled to be higher than the temperature of a clean room.

A temperature sensor 30 is provided in the clean room on the outside of the casing P. A temperature sensor 31 is provided in the casing P. The temperature sensors 30 and 31 are connected to a temperature control device 32. The temperature control device 32 serves to control the temperature of an out—casing heating device 34 provided on the outside of the casing P.

By such a structure, the out—casing heating device 34 is controlled by the temperature control device 32 based on signals sent from the temperature sensors 30 and 31. In the heating device 34, the gas fed into the casing P is regulated to a predetermined temperature, for example, 30° C. based on a control signal sent from the control device 32, and is introduced into the casing P.

In the second embodiment described above, the temperature of the gas introduced into the casing P is set higher than the temperature in the clean room so that the temperature in the casing P is kept higher than the temperature in the clean room. Consequently, an operating time can be shortened to enhance a processing capability.

Moreover, the gas fed from the heating device 34 which flows in the casing P is fed into the upper wall of the casing P and out of the lower wall thereof. Therefore, the temperature in the casing P can be kept more uniform. Besides, the gas introduced to the inside is heated on the outside of the casing P. Therefore, a place for installation in the casing P is not unnecessary required.

Next, the structure of a coating film forming apparatus according to a third embodiment of the present invention will be described with reference to FIG. 4.

The third embodiment is characterized in that a cooling device 35 for cooling a coating solution tank 14 (a coating solution temperature control device) is provided and a coating solution accommodated in the coating solution tank 14 is kept at a temperature which is lower than a temperature in a casing P by using the cooling device 35.

Figure 4:
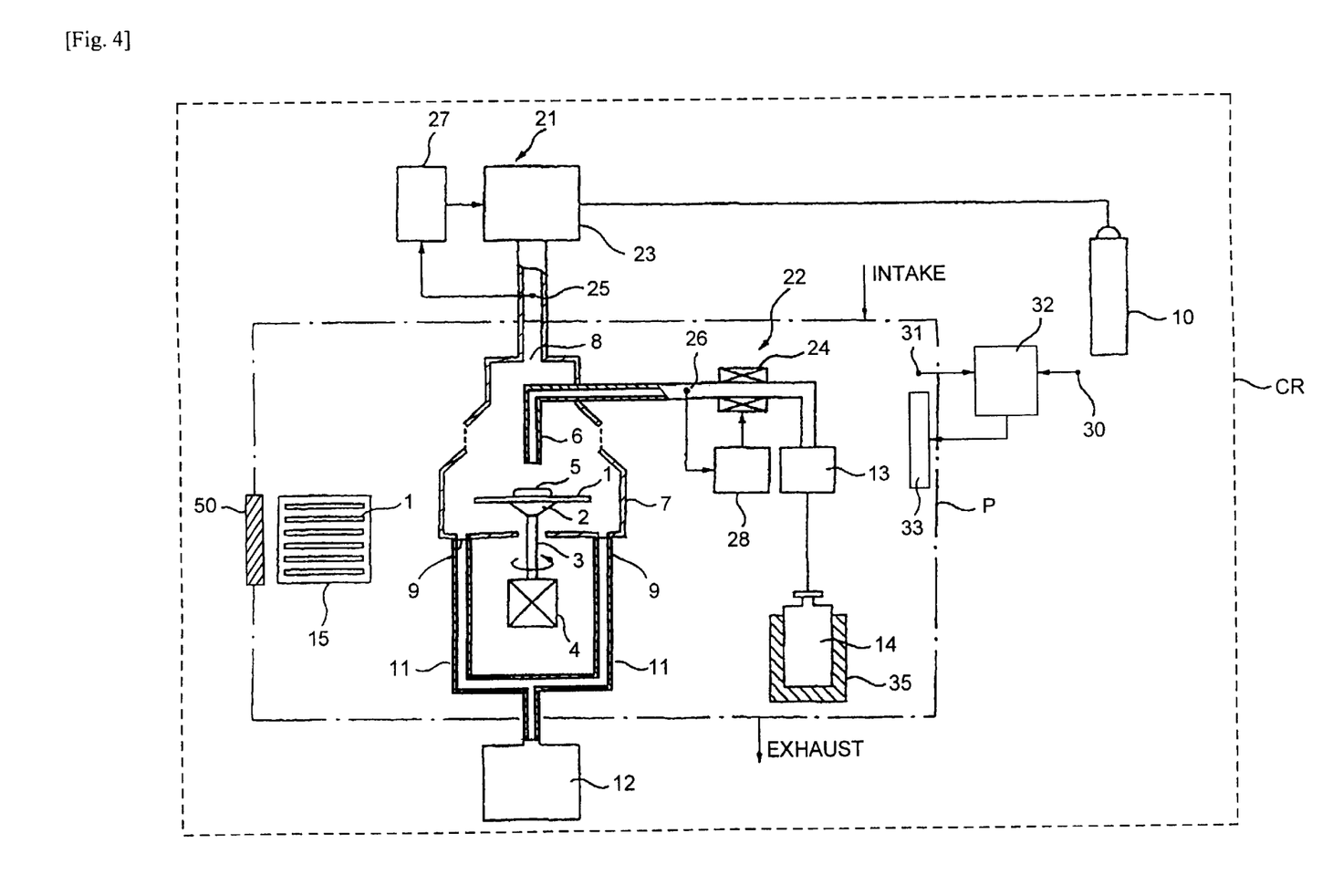
FIG. 4 is a diagram showing the structure of a coating film forming apparatus according to a third embodiment of the present invention.

FIG. 4 is a diagram showing the structure of the coating film forming apparatus according to the third embodiment of the present invention.

Provided is the cooling device 35 for keeping the coating solution tank 14 mounted in the casing P at a desirable temperature. Usually, the coating solution tank 14 is kept at the temperature which is lower than the temperature in the casing P, for example, about 5 degrees.

The reason is that a resist solution is sensitive to a change in the temperature and might be deteriorated if it is kept at a high temperature for a long period of time. As in the third embodiment, the coating solution tank 14 is usually cooled by the cooling device 35 to keep the coating solution at a low temperature, and the temperature is raised by a necessary amount by means of the temperature control device 22 in case of use. Consequently, the preserved coating solution can be prevented from being deteriorated by a temperature and a long life time can be obtained.

In the third embodiment described above, the temperature in the casing P is set and kept higher than the temperature in the clean room. Consequently, an operating time can be shortened to enhance a processing capability.

Moreover, a deterioration in quality of the coating solution can be suppressed by the cooling device 35, and a life time can be prolonged still more.

Next, the structure of a coating film forming apparatus according to a fourth embodiment of the present invention will be described with reference to FIG. 5.

The fourth embodiment is characterized in that only a coating solution tank 14 is provided in a clean room on the outside of a casing P.

Figure 5:
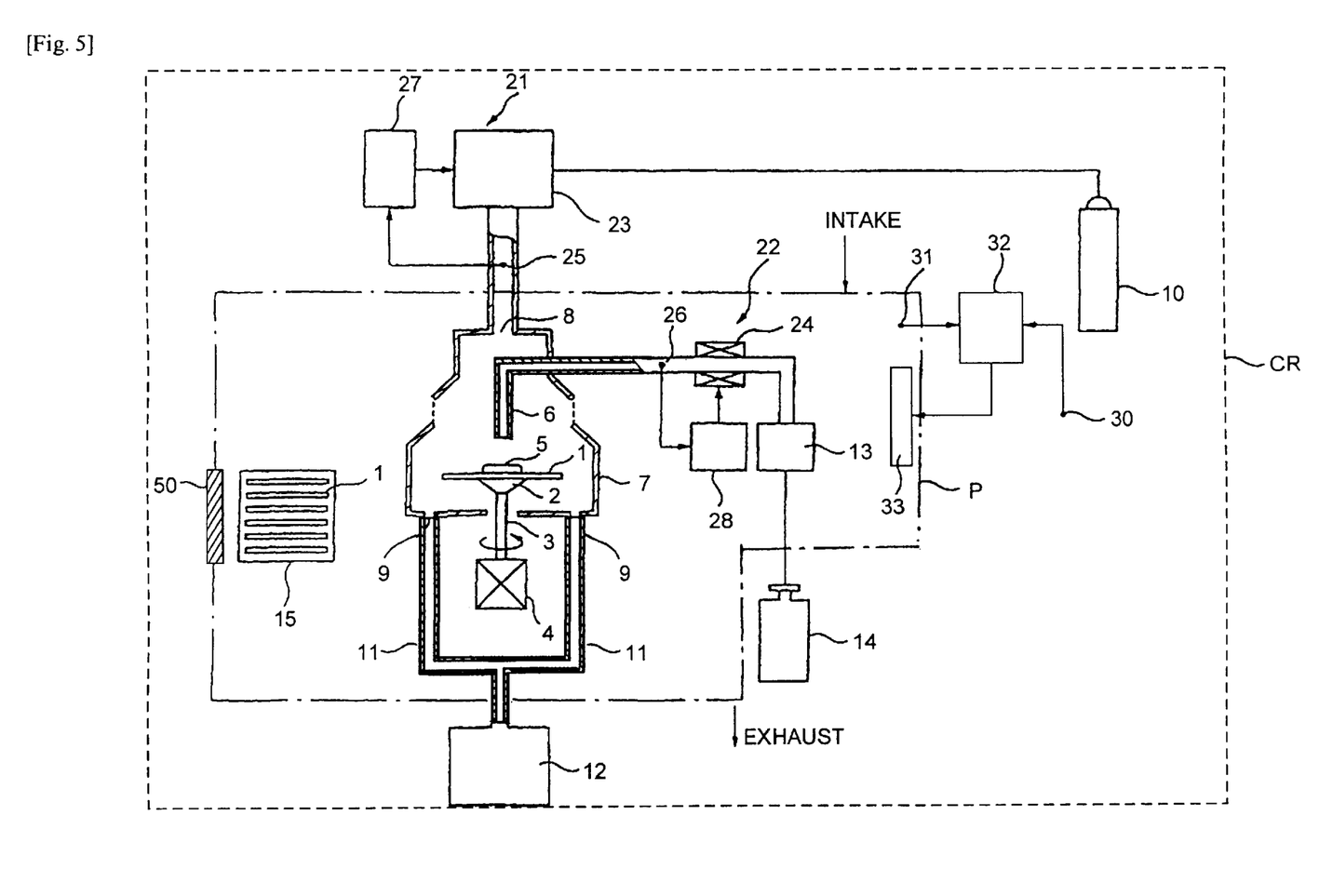
FIG. 5 is a diagram showing the structure of a coating film forming apparatus according to a fourth embodiment of the present invention.

FIG. 5 is a diagram showing the coating film forming apparatus according to the fourth embodiment of the present invention.

The coating solution tank 14 is mounted in the clean room on the outside of the casing P.

With such a structure, a temperature in the clean room is set within a range of 20° C. or less, for example. Therefore, the coating solution to be a resist film can be preserved.

According to the fourth embodiment described above, a temperature in the casing P is set and kept higher than the temperature in the clean room. Consequently, an operating time can be shortened to enhance a processing capability.

Moreover, in the case where the coating solution tank 14 is to be often replaced, keeping and replacing works and the like can be easily carried out by mounting the coating solution tank 14 in the clean room. Furthermore, the keeping and replacing works can be easily carried out and the coating solution tank 14 is held at a temperature at which a deterioration in the coating solution is suppressed. Therefore, a life time can be prolonged. In addition, it is also possible to reduce an area in the casing P where the coating solution tank 14 is to be provided. Besides, the coating solution tank 14 acting as a cooling source is not provided in the casing P. Therefore, the temperature in the casing P can be controlled more efficiently and uniformly.

Next, the structure of a coating film forming apparatus according to a fifth embodiment of the present invention will be described with reference to FIG. 6.

The fifth embodiment is characterized in that a temperature in a housing case 15 for a substrate to be coated can be controlled by a heater 39 (a temperature control device for a substrate to be coated) to be set to a preset temperature by means of a temperature measuring sensor 38 of the housing case 15 which accommodates a wafer to be a substrate 1 to be coated, a temperature sensor 37 (a temperature control device for a substrate to be coated) and a temperature control device 36 (a temperature control device for a substrate to be coated) which are provided on the outside of a casing P and the wafer of the housing case 15 is previously controlled to have a temperature almost equal to the temperature of the casing P.

Figure 6:
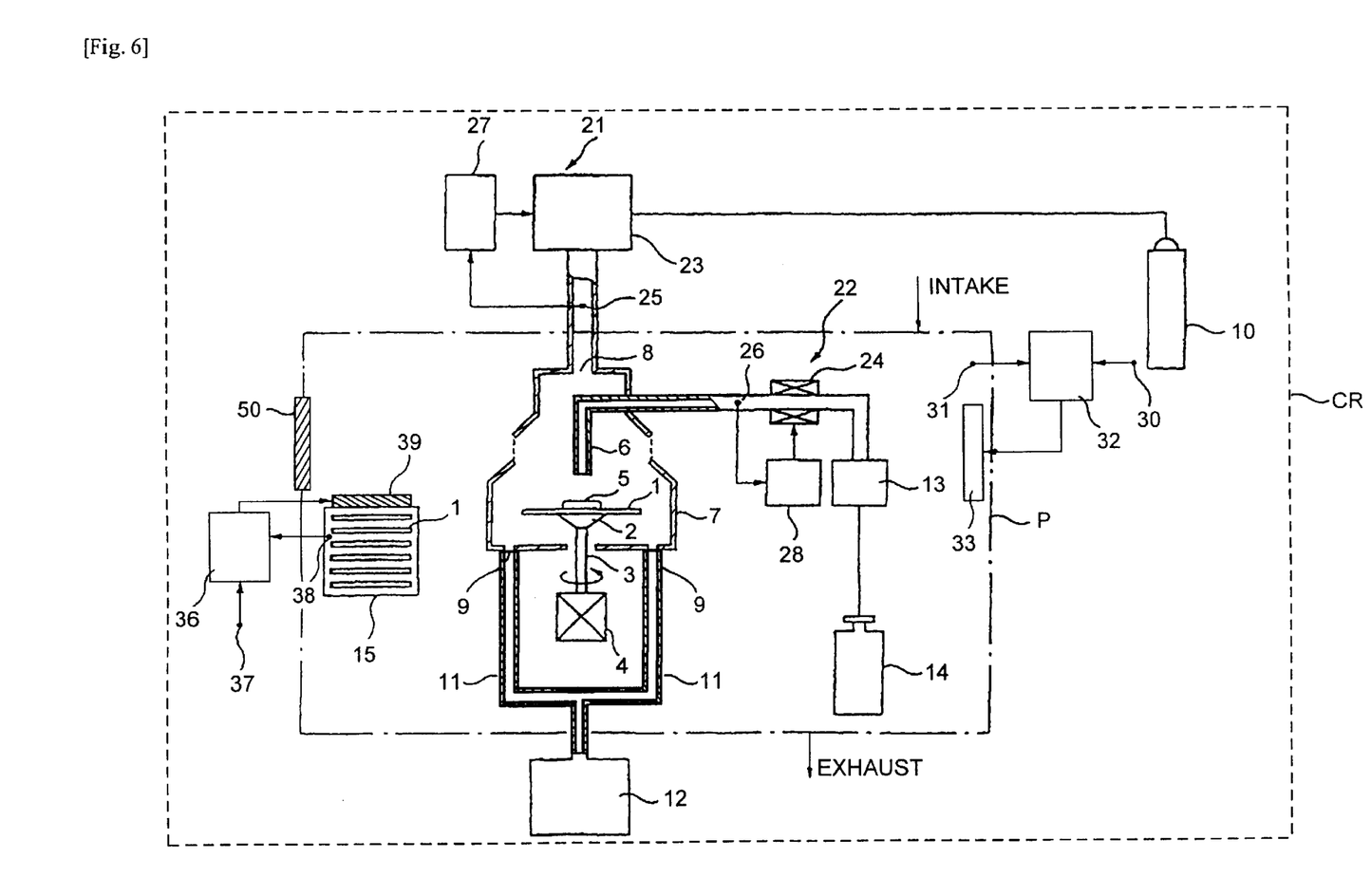
FIG. 6 is a diagram showing the structure of a coating film forming apparatus according to a fifth embodiment of the present invention.

FIG. 6 is a diagram showing the coating film forming apparatus according to the fifth embodiment of the present invention.

The temperature measuring sensor 38 is provided in the housing case 15 or in the vicinity thereof. The temperature sensor 37 for measuring a temperature in a clean room is provided on the outside of the casing P. The sensors 37 and 38 are connected to the temperature control device 36 and the output of each sensor is input to the temperature control device 36. A control signal sent from the temperature control device 36 is input to the heater 39 provided in the housing case 15 or in the vicinity of the housing case 15 and is controlled to have a desirable temperature. The temperature of the housing case 15, that is, the temperature of the substrate 1 to be coated is controlled to be substantially equal to the temperature in the casing P.

The heating energy of the heater 39 can have the same effects by steam and the like as well as electricity.

In the fifth embodiment, the temperature in the casing P is set and kept at a temperature which is higher than a temperature in a clean room. Consequently, an operating time can be shortened to enhance a processing capability.

Moreover, the temperature of the substrate 1 to be coated is controlled to be a predetermined temperature, for example, a temperature which is substantially equal to the temperature in the casing P. Consequently, the operating time can be shortened and the characteristics of a resist film can be made uniform. Furthermore, also in the case where the temperature of the substrate 1 to be coated is raised to a predetermined temperature, it is previously kept at a temperature which is substantially equal to the temperature in the casing P. Therefore, a time taken for a rise in the temperature can be shortened and the operating time can be shortened.

Next, the structure of a coating film forming apparatus according to a sixth embodiment of the present invention will be described with reference to FIG. 7.

The sixth embodiment is characterized in that a stirring fan 40 for circulating a gas in a casing P is provided in the casing P.

Figure 7:
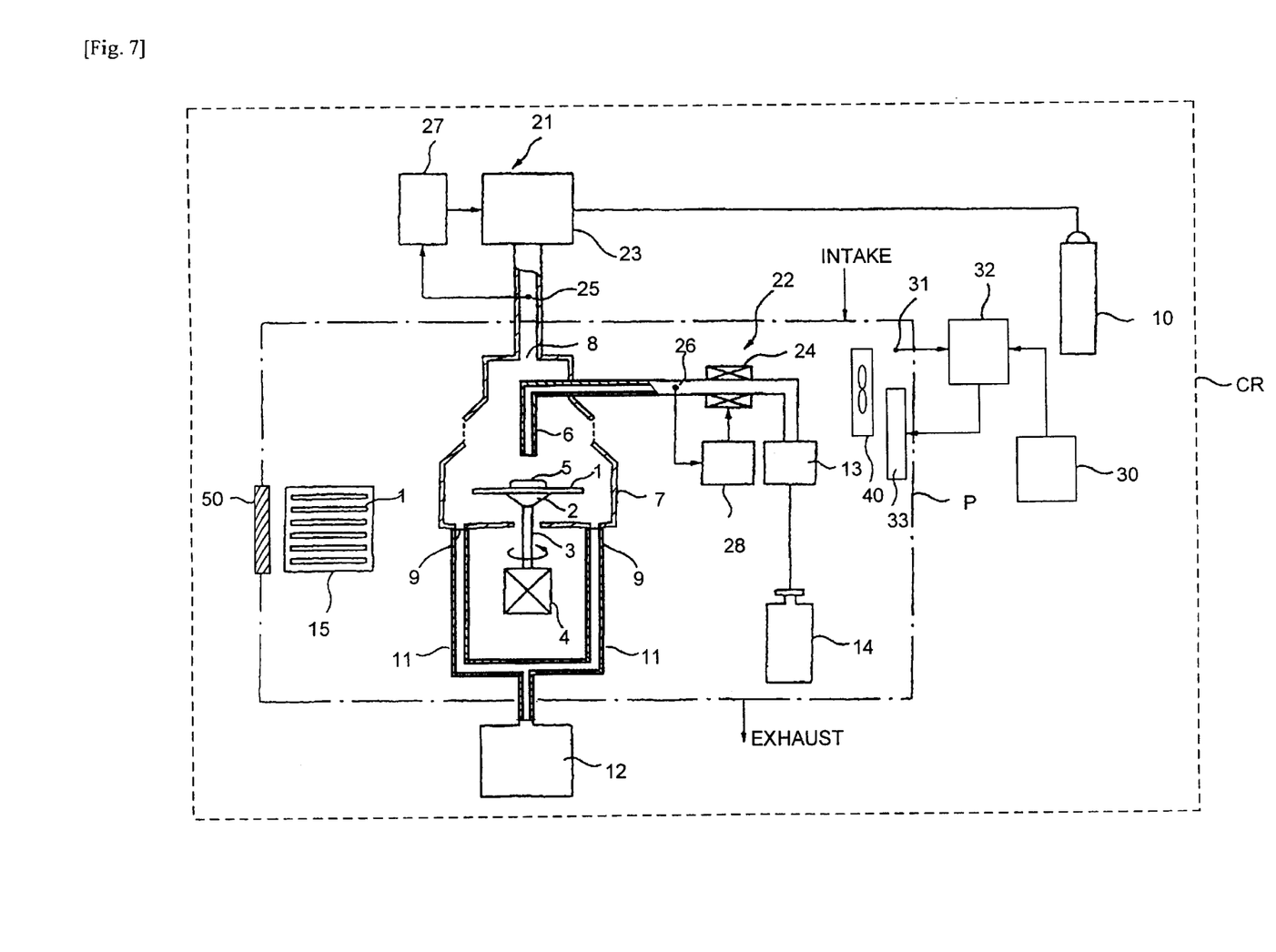
FIG. 7 is a diagram showing the structure of a coating film forming apparatus according to a sixth embodiment of the present invention.

FIG. 7 is a diagram showing the structure of a coating film forming apparatus according to the sixth embodiment of the present invention.

The fan 40 for circulating and stirring a gas flowing in the casing P is provided on a desirable position in the casing P. More preferably, a position where the fan 40 is to be fixed is set in a heating device 33 or in the vicinity of the heating device 33. The number of fans 40, a place for installation, a direction of a blast and a rotating operation may be set on any condition if they can be provided in the casing P.

By such a structure, the atmosphere (gas) in the casing P flows while stirring by the operation of the fan 40.

In the sixth embodiment described above, a temperature in the casing P is set and kept higher than a temperature in the clean room. Consequently, an operating time can be shortened to enhance a processing capability.

Moreover, the gas in the casing P is forcibly caused to flow and circulated by the fan 40. Consequently, the uniformity of the temperature in the casing P can be promoted. As a result, an operating time can be shortened still more.

Next, the structure of a coating film forming apparatus according to a seventh embodiment of the present invention will be described with reference to FIG. 8.

The seventh embodiment is characterized in that a housing case 15 having no external wall is provided in a casing P.

Figure 8:
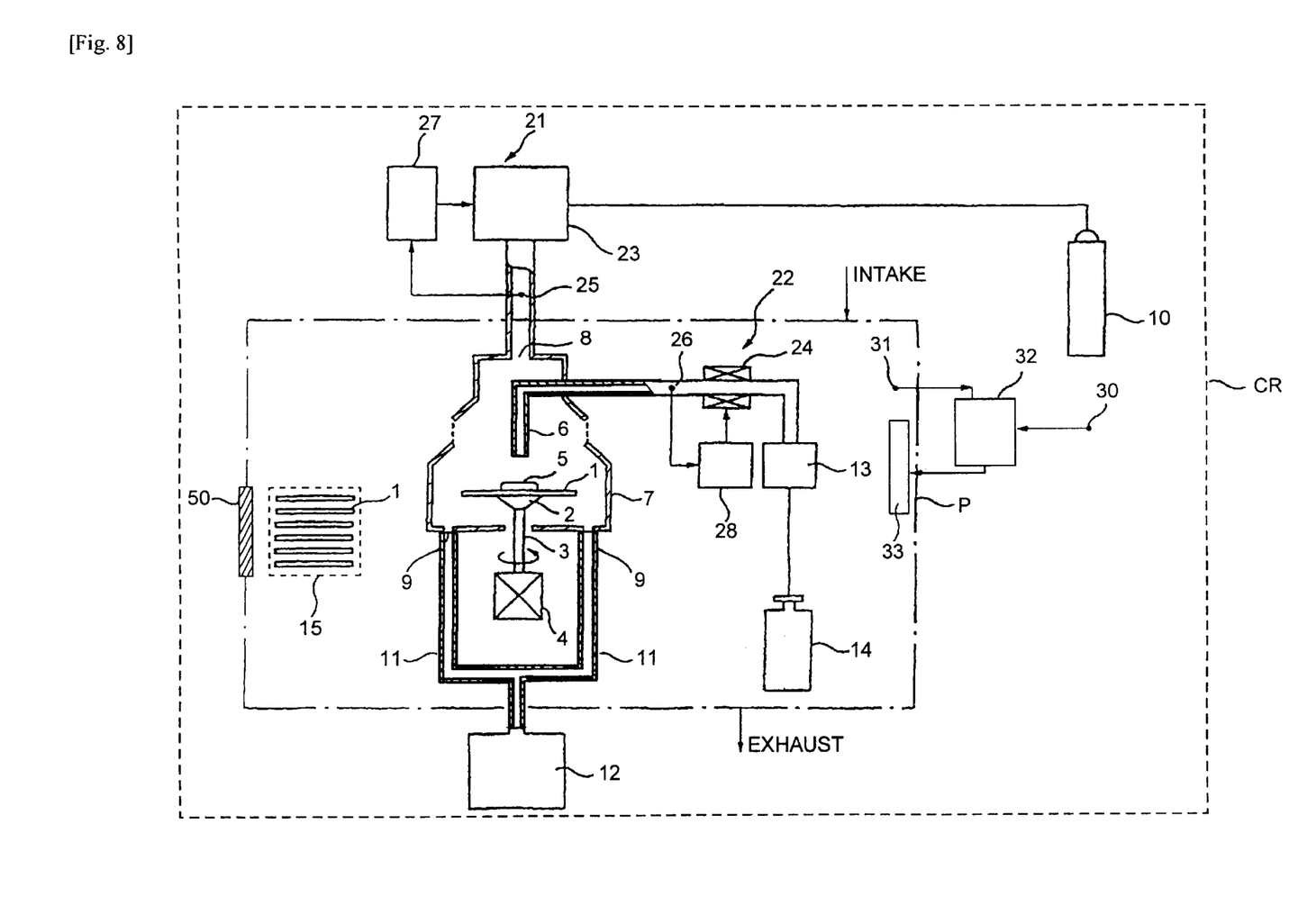
FIG. 8 is a diagram showing the structure of a coating film forming apparatus according to an seventh embodiment of the present invention.

FIG. 8 is a diagram showing the structure of the coating film forming apparatus according to the seventh embodiment of the present invention.

A plurality of wafers acting as substrates 1 to be coated are provided apart from each other at a predetermined interval in the housing case 15 provided in the casing P. The housing case 15 has no external wall but is set in the atmosphere which is substantially identical to the atmosphere in the casing P. In other words, environmental conditions such as a temperature, a humidity, a pressure and the like in each of the casing P and the housing case 15 are approximately identical.

In the seventh embodiment described above, the temperature in the casing P is set and kept higher than a temperature in a clean room. Consequently, an operating time can be shortened to enhance a processing capability.

Moreover, the housing case 15 is not provided with an external wall. Therefore, it is not necessary to provide a heating device for heating the substrate 1 to be coated to a desirable temperature, and the substrate 1 to be coated can be always set to have a temperature which is substantially equal to the temperature in the casing P. Accordingly, it is possible to shorten a time necessary for raising the temperature of the substrate 1 to be coated to a predetermined temperature. Thus, the operating time can be shortened.

Next, the structure of a coating film forming apparatus according to an eighth embodiment of the present invention will be described with reference to FIG. 9.

The eighth embodiment is characterized in that a chuck temperature control device 41 for keeping a chuck 2 at a predetermined temperature is provided in addition to a temperature control device 21 and a temperature control device 22.

Figure 9:
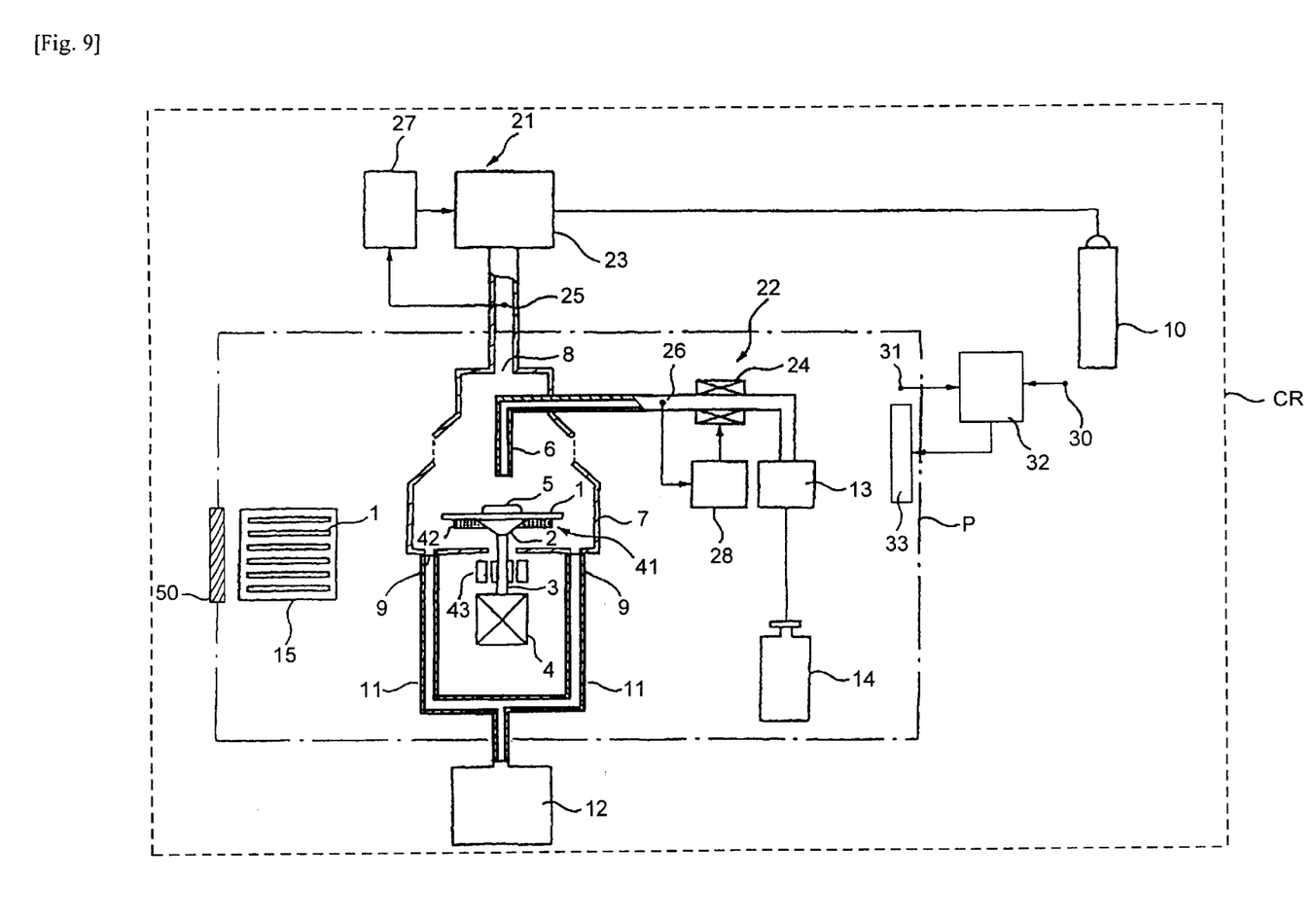
FIG. 9 is a diagram showing the structure of a coating film forming apparatus according to an eighth embodiment of the present invention.

FIG. 9 is a diagram showing the coating film forming apparatus according to the eighth embodiment of the present invention.

The temperature control device 41 is constituted by a heating device 42 having an electric heater fixed to the peripheral edge portion of the chuck 2, a rotary transformer 43 for feeding the heating device 42 from the outside, a temperature sensor which is not shown, and an input control device (not shown) for controlling the input of the heating device 42 such that a temperature detected by the temperature sensor is set to a predetermined temperature.

With such a structure, the chuck 2 can always be kept at a predetermined temperature. Therefore, it is possible to shorten a time necessary for raising the temperature of a substrate 1 to be coated to a predetermined temperature. Consequently, an operating time can be shortened still more. Moreover, the temperature of the substrate 1 to be coated is controlled. Therefore, the evaporation rate of the coating solution 5 can be enhanced.

In this example, in the case where the temperature of the coating solution 5 on the substrate to be coated can be set to a predetermined temperature by only temperature control performed by means of the temperature control device 41, other temperature control devices can be omitted. Also in this example, it is effective that means for keeping the coating solution at a low temperature is provided as in the apparatus shown in FIG. 4.

Figure 10:
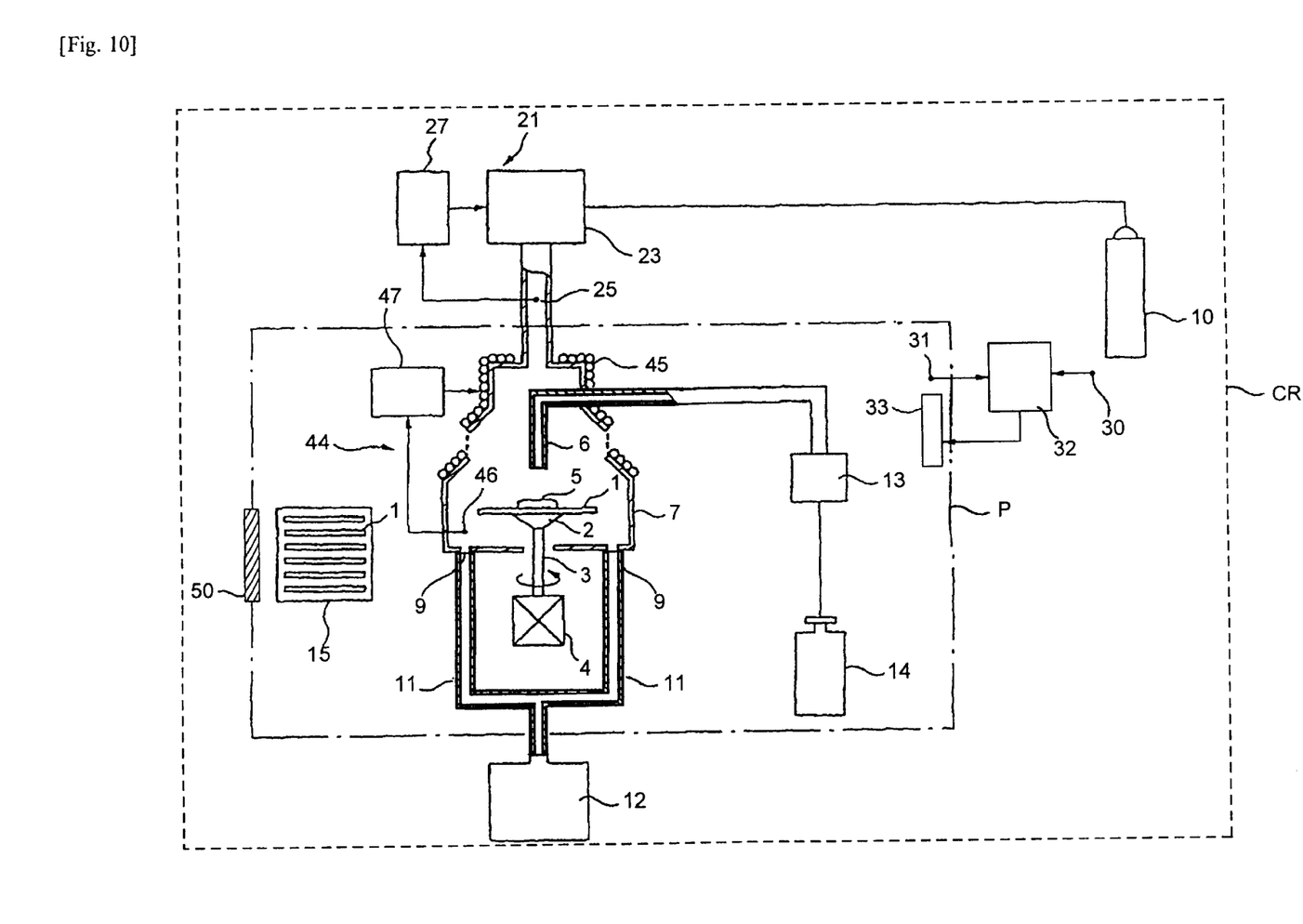
FIG. 10 is a diagram showing the structure of a coating film forming apparatus according to a ninth embodiment of the present invention.

Next, the structure of a coating film forming apparatus according to a ninth embodiment of the present invention will be described with reference to FIG. 10.

The ninth embodiment is characterized in that a chamber temperature control device 44 is provided for keeping a temperature in a chamber 7 at a temperature in a casing P which is equal to or higher than a temperature in a clean room where this kind of apparatus is to be provided through the outer surface of a chamber 7.

The temperature control device 44 is constituted by a heating device 45 which is formed by an electric heater or the like and is provided on the outer surface of the chamber 7, a temperature sensor 46 for detecting a downstream atmospheric temperature in the chamber 7, and an input control device 47 for controlling the input of the heating device 45 such that the temperature detected by the temperature sensor 46 has a predetermined value (the temperature in the casing P).

By such a structure, the temperature in the chamber 7 is detected by the temperature sensor 46 and the chamber 7 is heated by the heating device 45 so that the temperature in the casing P and the temperature in the chamber 7 are controlled to be substantially equal to each other.

In the case where the temperature of the coating solution 5 on a substrate 1 to be coated can be kept at a predetermined temperature by only temperature control performed by the temperature control device 44, other temperature control devices can be omitted. Also in this example, it is effective that means for keeping the coating solution at a low temperature is provided as in the apparatus shown in FIG. 4.

In the tenth embodiment described above, the temperature in the casing P is set and kept higher than the temperature in the clean room. Consequently, an operating time can be shortened to enhance a processing capability.

Moreover, the temperature in the chamber 7 is set substantially equal to the temperature in the casing P. Therefore, a process can be carried out more efficiently. Thus, a processing time can be shortened and the uniformity of the characteristic of a resist film can be achieved.

It is apparent that the present invention is not restricted to the above-mentioned embodiments but can be variously changed and carried out without departing from the scope of the invention. For example, while a semiconductor wafer has been assumed as the substrate to be coated, the present invention can also be applied to a liquid crystal substrate and the like. Moreover, such a structure as to take the environment into consideration can be obtained by causing the gas exhausted from the chamber 7 to pass through excepted devices (not shown).

What is claimed is:

1. A coating film forming apparatus comprising:
   a spin coater including a holder for rotatably holding a substrate to be coated and a nozzle provided above the substrate to be coated which is held by the holder for dropping a coating solution onto a surface of the substrate to be coated, and serving to rotate the holder to spread the coating solution over the substrate to be coated by centrifugal force, thereby forming a coating film on the surface of the substrate to be coated;
   a chamber for covering the spin coater to form a constant space around the spin coater;
   a coating solution feeding pump connected to the nozzle for feeding the coating solution into the chamber;
   a coating solution tank coupled to the coating solution feeding pump for storing the coating solution;
   a gas introducing pipe connected to the chamber for introducing a gas into the chamber;
   a gas exhaust pump connected to the chamber for exhausting a gas from the chamber;
   a tank for the substrate to be coated provided on an outside of the chamber for storing the substrate to be coated delivered into the chamber;
   a casing including therein the spin coater, the chamber and the tank for the substrate to be coated; and
   a temperature control device provided in the casing for controlling a temperature in the casing to be higher than the temperature on the outside of the casing,
   wherein the temperature in the casing is controlled within a range of 7° C.±5° C. with respect to the temperature on the outside of the casing by said temperature control device.

2. A coating film forming apparatus according to claim 1, wherein the gas exhaust pump serves to exhaust a gas in the chamber and to set an inside of the chamber to have a reduced pressure.

3. A coating film forming apparatus according to claim 1, further comprising a gas temperature control device configured to control the temperature of the gas introduced into the chamber to be set higher than the temperature on the outside of the casing.

4. A coating film forming apparatus according to claim 1, further comprising a coating solution temperature control device configured to control the coating solution tank for storing the coating solution to have a temperature which is lower than the temperature in the casing.

5. A coating film forming apparatus according to claim 1, wherein the coating solution tank is provided outside the casing.

6. A coating film forming apparatus according to claim 1, further comprising a temperature control device for a substrate to be coated configured to control the temperature of the substrate to be coated to be set higher than the temperature on the outside of the casing, being provided in the tank for the substrate to be coated in which the substrate to be coated is stored.

7. A coating film forming apparatus according to claim 1, further comprising a coating solution temperature control device configured to control the temperature of the coating solution sent from the coating solution tank to be set higher than the temperature on the outside of the casing.

8. A coating film forming apparatus according to claim 1, further comprising a holder temperature control device configured to control the temperature of the substrate to be coated to be set higher than the temperature on the outside of the casing, being provided on the holder.

9. A coating film forming apparatus according to claim 1, further comprising a chamber temperature control device configured to control the temperature of the chamber to be set higher than the temperature on the outside of the casing, being provided on the chamber.

10. A coating film forming apparatus according to claim 1, wherein the substrate to be coated is fed into the chamber at a higher temperature than the temperature on the outside of the casing.

11. A coating film forming apparatus according to claim 1, wherein an atmosphere in the tank for the substrate to be coated is substantially identical to an atmosphere in the casing.

12. A coating film forming apparatus according to claim 11, wherein at least two of the gas, the coating solution and the tank for a substrate to be coated have temperatures which are substantially equal to each other.

13. A coating film forming apparatus according to claim 11, wherein the temperature of the substrate to be coated to be fed into the chamber is substantially equal to the temperature of at least one of the gas, the coating solution and the tank for a substrate to be coated.

14. A coating film forming apparatus according to claim 1, further comprising a fan configured for circulating and stirring a gas flowing in the casing.

* * * * *